United States Patent
Sofer et al.

(10) Patent No.: US 9,903,916 B2
(45) Date of Patent: Feb. 27, 2018

(54) SCAN TEST SYSTEM WITH A TEST INTERFACE HAVING A CLOCK CONTROL UNIT FOR STRETCHING A POWER SHIFT CYCLE

(71) Applicants: Sergey Sofer, Rishon Lezion (IL); Asher Berkovitz, Kiryat Ono (IL); Michael Priel, Netanya (IL)

(72) Inventors: Sergey Sofer, Rishon Lezion (IL); Asher Berkovitz, Kiryat Ono (IL); Michael Priel, Netanya (IL)

(73) Assignee: NXP USA, Inc., Austin, TX (US)

( * ) Notice: Subject to any disclaimer, the term of this patent is extended or adjusted under 35 U.S.C. 154(b) by 274 days.

(21) Appl. No.: 14/431,794

(22) PCT Filed: Sep. 27, 2012

(86) PCT No.: PCT/IB2012/055159
§ 371 (c)(1),
(2) Date: Mar. 27, 2015

(87) PCT Pub. No.: WO2014/049395
PCT Pub. Date: Apr. 3, 2014

(65) Prior Publication Data
US 2015/0247899 A1    Sep. 3, 2015

(51) Int. Cl.
*G01R 31/3185* (2006.01)
(52) U.S. Cl.
CPC ............. *G01R 31/318544* (2013.01); *G01R 31/318575* (2013.01)

(58) Field of Classification Search
CPC .... G01R 31/318544; G01R 31/318575; G01R 31/31721; G01R 31/318552; Y02B 60/1282; G06F 1/3237; G06F 1/3234
(Continued)

(56) References Cited

U.S. PATENT DOCUMENTS

2003/0046643 A1*  3/2003  Ohta .............. G01R 31/318558
                                                    716/133
2003/0106003 A1    6/2003  Whetsel
(Continued)

OTHER PUBLICATIONS

J. Saxena, K. M. Butler and L. Whetsel, "An analysis of power reduction techniques in scan testing," Proceedings International Test Conference 2001 (Cat. No. 01CH37260), Baltimore, MD, 2001, pp. 670-677.*

(Continued)

*Primary Examiner* — Cynthia Britt

(57) ABSTRACT

A method generates scan patterns for testing an electronic device called DUT having a scan path. A scan tester is arranged for executing a scan shift mode and a capture mode. A scan test interface has a clock control unit for stretching a shift cycle of the scan clock in dependence of a scan clock pattern. The method determines at least one power shift cycle which is expected to cause a voltage drop of a supply voltage exceeding a predetermined threshold during respective shift cycles of the scan shift mode, and generates, in addition to the scan pattern, a scan clock pattern indicative of stretching the power shift cycle. Advantageously, a relatively high scan shift frequency may be used while avoiding detrimental effects of said voltage drop by extending the respective power shift cycle, whereby test time and yield loss are reduced.

17 Claims, 6 Drawing Sheets

(58) Field of Classification Search
USPC .......................................................... 714/731
See application file for complete search history.

(56) References Cited

U.S. PATENT DOCUMENTS

| | | | |
|---|---|---|---|
| 2004/0223386 A1* | 11/2004 | Mudge .................. | G06F 1/3203 365/202 |
| 2005/0022094 A1* | 1/2005 | Mudge .................. | G06F 9/3861 714/758 |
| 2005/0229056 A1 | 10/2005 | Rohrbaugh et al. | |
| 2006/0129900 A1* | 6/2006 | Clark ............. | G01R 31/318575 714/726 |
| 2006/0280002 A1* | 12/2006 | Bull ...................... | G06F 9/3869 365/189.07 |
| 2008/0195346 A1 | 8/2008 | Lin et al. | |
| 2009/0254787 A1* | 10/2009 | Ramachandran | G01R 31/318575 714/731 |
| 2010/0058107 A1* | 3/2010 | Blaauw ............... | G06F 11/0721 714/2 |
| 2011/0107166 A1* | 5/2011 | Flautner .............. | G06F 11/1604 714/746 |
| 2011/0260767 A1 | 10/2011 | Devta Prasanna et al. | |
| 2012/0246529 A1 | 9/2012 | Tekumalla et al. | |
| 2014/0189452 A1* | 7/2014 | Sonawane ...... | G01R 31/318555 714/727 |

OTHER PUBLICATIONS

B. H. Chen, W. C. Kao, B. C. Bai, S. T. Shen and J. C. M. Li, "Response Inversion Scan Cell (RISC): A Peak Capture Power Reduction Technique," 16th Asian Test Symposium (ATS 2007), Beijing, 2007, pp. 425-432.*

J. Li, Q. Xu, Y. Hu and X. Li, "X-Filling for Simultaneous Shift- and Capture-Power Reduction in At-Speed Scan-Based Testing," in IEEE Transactions on Very Large Scale Integration (VLSI) Systems, vol. 18, No. 7, pp. 1081-1092, Jul. 2010.*

Badereddine, Nabil et al: "Minimizing Peak Power Consumption during Scan Testing: Test Pattern Modification with X Filling Heuristics", IEEE, Design and Test of Integrated Systems in Nanoscale Technology, 2006. DTIS 2006. International Conference, Sep. 5-7, 2006, pp. 359-364.

International Search Report and Written Opinion correlating to PCT/IB2012/055159 dated Apr. 26, 2013.

SYNOPSYS: "Testing Low Power Designs with Power-Aware Test", Manage Manufacturing Test Power Issues with DFTMAX# and TetraMAX, webpage: http://www.synopsys.com/Tools/Implementation/RTLSynthesis/CapsuleModule/Testing-LP-PATest-WP.pdf, Apr. 2010, pp. 1-5.

Open-Silicon: "Lowest Test Costs—TestMAX", webpage: http://www.open-silicon.com/max-technology/#testmax, pp. 8-9.

SpringerLink: "Scan Shift Power Reduction by Freezing Power Sensitive Scan Cells", webpage: http://link.springer.com/article/10.1007%2Fs10836-007-5048-9, Journal of Electronic Testing, vol. 24, No. 4, pp. 327-334.

Ramachandran, Aditya: "Dynamic-Shift-Frequency-Scaling-of-ATPG-Patterns", Open-Silicon, Published on Oct. 29, 2008, webpage: http://www.slideshare.net/adityr/dynamic-shift-frequency-scaling-of-atpg-patterns-presentation, pp. 1-27.

Mentor Graphics "Tessent TestKompress User's Guide;" Software Version 9.6, pp. 1 and 134, Nov. 2011.

* cited by examiner

SCAN TEST SYSTEM WITH A TEST INTERFACE HAVING A CLOCK CONTROL UNIT FOR STRETCHING A POWER SHIFT CYCLE

FIELD OF THE INVENTION

The invention relates to a system for scan test of an electronic device.

BACKGROUND OF THE INVENTION

The paper "Minimizing Peak Power Consumption during Scan Testing: Test Pattern Modification with X Filling Heuristics, by Nabil Badereddine, Patrick Girard, Serge Pravossoudovitch, Christian Landrault, Arnaud Virazel, Hans-Joachim Wunderlich, published by IEEE in 2006, available from http://hal-lirmm.ccsd.cnrs.fr/docs/00/09/36/90/PDF/DTIS06-53.pdf" describes a scan test system. Scan architectures are expensive in power consumption. In the paper, the issues of excessive peak power consumption during scan testing are discussed. Taking care of high current levels during the test cycle (i.e. between launch and capture) is highly relevant to avoid noise phenomena such as IR-drop or ground bounce.

While many techniques have evolved to address power minimization during the functional mode of operation, it is required to manage power during test mode. Circuit activity is substantially higher during test than during functional mode, and the resulting excessive power consumption can cause structural damage or severe decrease in reliability of the circuit under test. In the context of scan testing, the problem of excessive power during test is much more severe as the application of each test pattern requires a large number of shift operations that contributes to unnecessarily increasing the switching activity. Power consumption must be analyzed from two different perspectives. Average power consumption is, as the name implies, the average power utilized over a long period of operation or a large number of clock cycles. Instantaneous power is the amount of power required during a small instant of time such as the portion of a clock cycle immediately following the system clock rising or falling edge. The peak power is the maximum value of the instantaneous power. Average power consumption during scan testing can be controlled by reducing the scan clock frequency a well known solution used in industry. In contrast, peak power consumption during scan testing is independent of the clock frequency and hence is much more difficult to control.

Scan patterns in some designs may consume much more peak power over the normal mode and may result in failures during manufacturing test. Combined with high speed, excessive peak power during test also causes high rates of current (di/dt) in the power and ground rails and hence leads to excessive power and ground noise (VDD or Ground bounce). This may erroneously change the logic state of some circuit nodes or flip-flops and cause some good dies to fail the test, thus leading to unnecessary loss of yield. Similarly, IR-drop and crosstalk effects are phenomena that may show up an error in test mode but not in functional mode. With high peak current demands during test, the voltages at some gates in the circuit are reduced. This causes these gates to exhibit higher delays, possibly leading to test fails and yield loss.

The problem of excessive peak power during scan testing can be divided in two sub-problems: excessive peak power during load/unload cycles and excessive peak power during the test cycle, denoted as TC and defined as the clock cycle between launch and capture. Several techniques have been proposed for reducing test power dissipation during load/unload cycles. Most of them are initially targeted for reducing average power but they usually can reduce peak power as well. Some low power scan architectures reduce the clock rate on the scan cells during shift operations thus reducing the power consumption without increasing the test time. Other solutions consist in assigning don't care bits of the deterministic test cubes used during test in such a way that it can reduce the peak power.

Compared to load/unload cycles, peak power reduction during TC is a less researched area. In the above paper a proposal is based on power-aware assignment of don't care bits in deterministic test patterns. The proposal addresses the power consumption during shift by controlling the pattern's logic states.

However, in the above system, a problem of the scan test patterns is that, during the shift mode (in the load/unload cycles), the excessive power consumption limits the maximum scan clock.

SUMMARY OF THE INVENTION

The present invention provides a method, scan tester and an electronic device, as described in the accompanying claims.

Specific embodiments of the invention are set forth in the dependent claims. Aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

Figure 1:
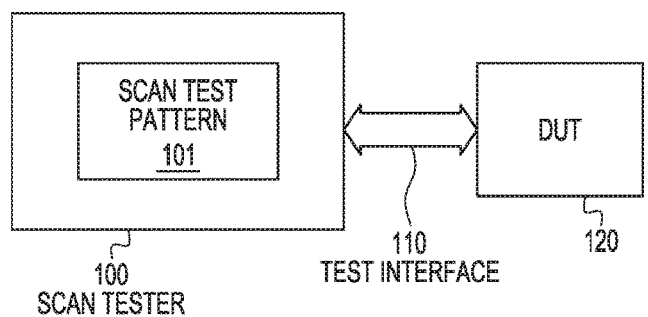
FIG. 1 shows an example of a scan test system.

FIG. 1 shows an example of a scan test system. The scan test system comprises a scan tester 100 and an electronic device 120 that is to be tested, also named device under test or DUT. The scan tester is coupled to the DUT via a test interface 110, which interface has a set of signals to transfer data to and or from the DUT. At least the test interface has a scan clock, a scan-in signal and a scan-out signal. A scan-enable signal may be available for controlling the scan mode and/or scan clock.

The scan tester 100 is provided with at least one scan pattern 101, which is generated according to a method for generating at least one scan pattern for a scan tester for scan test of an electronic device having a digital function. The generating method is described below.

The scan tester is arranged to be coupled via the test interface 110 to the electronic device 120. The scan tester is arranged for executing a scan shift mode in which scan-in data is shifted from the scan tester to the DUT and/or scan result data is shifted from DUT to the scan tester. Furthermore, the scan tester is arranged for executing a capture mode in which the device is performing the digital function for a predetermined number of operational clock cycles, based on the scan-enable signal's value.

The essence of a at speed scan test is first activating the scan shift mode for initializing flip-flops in the DUT (i.e. a device under test having the scan test circuitry) with pre-defined values by "shifting" the data via a test interface using a slow shift clock, and subsequently, in the capture mode, allowing one to few fast clock cycles for real operational test of the digital function, i.e. testing the circuits and electrical paths. The resulting state of the logical elements may be shifted out via the scan path using the scan shift clock for analyzing the operational performance of the device.

Figure 2:
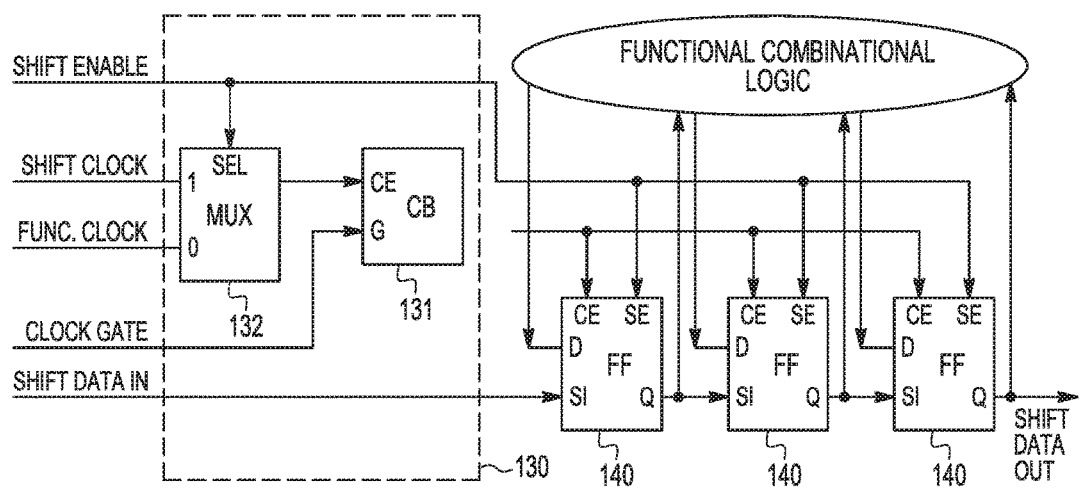
FIG. 2 shows an example of an electronic device to be tested via a scan test.

FIG. 2 shows an example of an electronic device to be tested via a scan test. The device has logical elements 140 operationally coupled via functional combinatorial logic as schematically indicated in the Figure. As such, the logical elements so coupled are for performing the digital function in an intended operational mode of the device.

The logical elements 140 are also coupled via a scan path for performing a scan test according to a scan pattern defining a sequence of scan-in data corresponding to a starting state of the logical elements. Thereto the device has inputs and/or outputs including a clock input, and a shift data input for inputting scan input data, and a shift data output for outputting scan result data. During the scan-shift mode scan-in data is shifted from the scan tester to the logical elements via the scan path and/or device data is shifted from the logical elements to the scan tester. During the capture mode the device is performing the digital function for a predetermined number of operational clock cycles of a so-called functional clock.

The method of generating the scan patterns includes the following steps. The scan pattern is generated in dependence of data of the device to be tested, in particular in dependence of the logical elements and the intended digital function. As such, scan testing of electronic circuits, in particular integrated circuits, is well known.

In the current system, generating the scan pattern further includes determining at least one power shift cycle which is expected to cause a voltage drop of a supply voltage exceeding a predetermined threshold during respective shift cycles of the scan shift mode, and subsequently generating, in addition to the scan pattern, a scan clock pattern indicative of stretching a shift cycle that follows the power shift cycle. Furthermore, the test interface has a clock control unit for stretching a shift cycle of the scan clock in dependence of the scan clock pattern.

FIG. 2 further shows an example of a clock control unit 130 for stretching a shift cycle of the scan clock in dependence of the scan clock pattern. The clock control unit has a multiplexer 132 for selecting a shift clock in the shift mode and a functional clock in the capture mode. Furthermore, the clock control unit has a clock gate 131 for stretching a clock pulse when a clock gate input signal is activated by said scan clock pattern. The clock control unit 130 may be included in the scan tester 100 or may be part of the test interface 110.

Optionally, the electronic device for use with the above scan tester is adapted to include the clock control unit for stretching a shift cycle of the scan clock in dependence of a scan clock pattern. The scan clock pattern is indicative of stretching a power shift cycle which is expected to cause a voltage drop of a supply voltage exceeding a predetermined threshold during respective shift cycles of the scan shift mode.

Furthermore, the clock control unit may be arranged for deriving a stretching signal from a multitude of device inputs for providing the scan clock having said stretched shift cycle that follows the power shift cycle. A single input called shift enable may be controlled via the scan-enable signal and for activating a scan mode in the electronic device. When so activated, a further input that has an operational function may now be logically decoupled from its functional environment and may be coupled to the clock control unit. Hence the number of required input signals on the electronic device is reduced. It is noted that the electronic device may, in practice, be an integrated circuit.

Determining the power shift cycles is based the following considerations. In a device to be tested the power supply (PS) network is characterized by its impedance.

Figure 3:
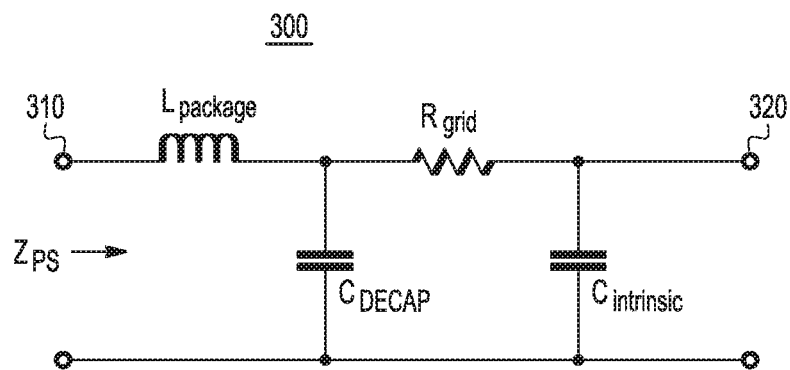
FIG. 3 shows an example of power supply network impedance.

FIG. 3 shows an example of power supply network impedance. A power supply equivalent circuit 300 has an impedance Zs, and has a supply power tap point 310 which is to be connected to a supply power source. The electronic logical elements to be supplied are to be connected to a load point 320. In between an inductance Lpackage represents the inductance of leads of a package of the electronic device, capacitors Cdecap and Cintrinsic represent internal capacitances in the device, and Rgrid represents resistance of internal power lines (also called grid). The power supply impedance may be used to derive an expected voltage drop related to a power consumption of the logical elements peak due to a shift cycle.

Figure 4:
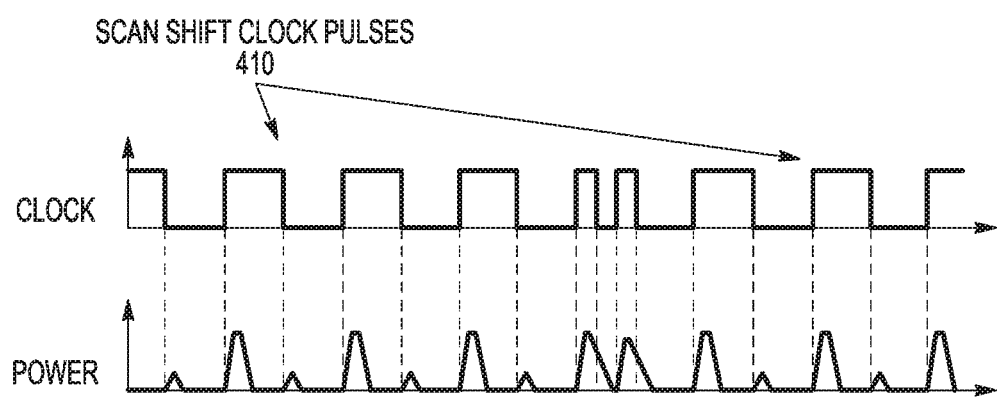
FIG. 4 shows an example of a scan test clock and a power signal.

FIG. 4 shows a scan test clock and a power signal. The lower curve marked Power is an example of the fluctuation on the power line at the load point during scan testing due to fluctuations in power consumption. The upper curve marked Clock depicts the scan test clock pulses, having during shift mode relatively long scan shift clock pulses 410 and during capture mode having relatively short scan test operational clock pulses at the functional speed of the DUT, in combination depicting a so-called "at speed" scan test. The "at speed scan test" is an efficient test method for testing the functionality of internal circuits of an electronic device or integrated circuit, including maximum frequency determination.

Conventionally, during the capture period the circuit may draw a relatively large supply current and may cause a large voltage drop over the power supply network due to the power line impedances similar to FIG. 3. Generation of the scan patterns may include an effort of power consumption reduction during the capture periods. However, conventionally it is assumed that the supply current, drawn during the shift cycles, is not important to affect circuit behavior.

It was found that some scan tests, for example involving isolated power domains, may encounter yield loss, due to extremely high supply voltage drop caused by excessive current during the shifts. Moreover, elevation of the scan frequency for test time reduction decreases the manufacturing cost. It is proposed to analyze power consumption of shift cycles. Based on the analysis, so-called power cycles are determined which have excessive power consumption above a predetermined threshold. A scan clock pattern is generated corresponding to the scan pattern for the respective device. The scan clock pattern indicates where scan clock pulses must be stretched after the occurrence of such power cycles. Hence a relatively high scan shift frequency can be used to decrease test time, while avoiding yield loss. The introduction of power awareness during shift enables elevation of the "base" shift frequency.

Figure 5:
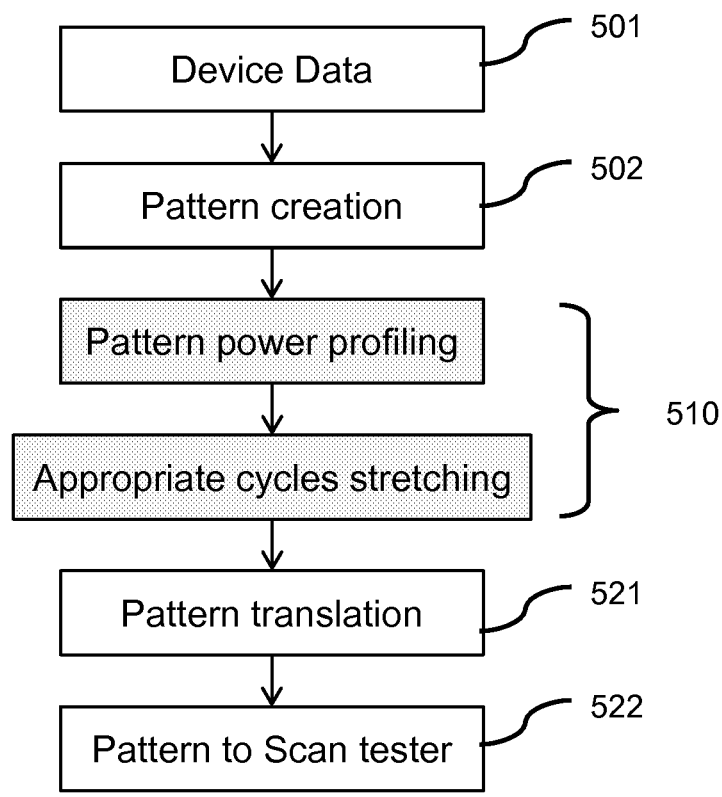
FIG. 5 shows an example of a method of generating scan patterns.

FIG. 5 shows an example of a method of generating scan patterns. The method starts at a first step Device Data 501 that performs receiving and processing device data of the device to be tested. In a next step Pattern Creation 502 scan patterns are designed for scan testing the electronic device. As such the creation of scan patterns is well known in the art of device testing, for example from the document mentioned in the introductory part and further documents referenced therein.

Subsequently, in steps Pattern Power Profiling and Appropriate Cycles Stretching 510, the power shift cycles are determined. For the scan pattern or patterns created above, the respective shift cycles are analyzed for power consumption. When the power consumption is high, a high local power line voltage drop is expected, and the corresponding shift cycle is determined to be a power shift cycle. The power threshold may be set based on measurements, experience or simulation of the specific product, or technology of the DUT, and/or scan test methodology and shift clock frequency in the scan test system to be used.

Subsequently, in step Pattern Translation 521, the scan clock pattern is generated, and the scan pattern and the corresponding scan clock pattern are translated for use in the actual scan tester. Finally, in the step Pattern to Scan Tester 522, the respective scan patterns and scan clock patterns are transferred to the scan tester.

During the pattern generation process, in the Pattern Power Profiling step, for the basic scan patterns a power profiling is performed. Then, in the Appropriate Cycles Stretching step, each power shift cycle, i.e. when the power consumption is high, is stretched. Stretching such a power cycle means that the next active clock edge is delayed via a clock control circuit in the test interface between the scan tester and the logical elements to be tested in the DUT. For example, the stretching may be achieved by activating a clock delay circuit, e.g. a programmable counter running on a frequency higher than the shift clock controlling a clock gate, which delays the start of the next shift clock cycle. In an embodiment, the stretching is performed by suppressing at least one clock cycle of a periodic scan clock following the power cycle. This may be named inserting a dummy shift clock cycle, in which actually no shifting is performed in the DUT, and the scan data in the scan pattern must kept stable. This may be achieved by actually stopping the outputting (or inputting) of scan data. Alternatively, the progress of the outputting of the scan-in data from the scan tester may proceed by the unmodified scan shift clock, while duplicating the scan-in data in the scan pattern at the location of the dummy shift clock cycle. Also, in the scan-out data received at the scan tester, the duplicated bits have to be ignored or removed.

The method, capable of generating scan pattern for an integrated circuit with dynamic scan support, may include power profiling software capable of calculation of power consumption of said integrated circuit during scan shifting at a fine time resolution with respect to the scan shift clock. The scan pattern generation software is adapted for taking such power profiling results, and selecting the shift cycles with excessive power consumption and stretching such shift cycles, respectively postponing cycles after said power consuming cycles. In such power profiling software, the time resolution is better than one shift cycle length. In an embodiment, the shift cycles stretching may be achieved by gating of one shift clock change subsequent to the power cycle, i.e. increasing the effective shift period by the factor of at least two.

Optionally, the scan clock pattern comprises clock stretch data indicative of the amount of stretching of the corresponding scan clock pulse. For example, the scan clock pattern may indicate a particular clock pulse to be stretched by a relative or absolute amount of time, e.g. in fractions of the scan shift clock period, or by indicating a number of scan clock pulses that is to be suppressed.

Optionally, the scan clock pattern comprises dummy clock data indicative of instants where the corresponding scan clock pulse is to be omitted for stretching the power shift cycle. For example, the scan clock pattern may have a particular indicator data field for each corresponding to the respective data bit sequence of the scan pattern. The indicator data field, for example a flag bit, may indicate whether to insert a dummy clock cycle for omitting a scan shift clock pulse.

Optionally, the method includes determining a power consumption in at least a part of the electronic device during respective shift cycles of the scan shift mode, and determining the at least one power shift cycle where the power consumption exceeds a predetermined threshold. The threshold may be determined based on measurements or experience with a particular device technology, and may involve determining an additional delay in relation to peak power consumption and related supply voltage drop.

Optionally, the method includes determining a power consumption in at least a part of the electronic device during respective shift cycles of the scan shift mode. Subsequently, for example by measurements or simulation, the method proceeds by determining a voltage drop in dependence of the power consumption so determined. The power consumption of parts of the electronic device that are coupled to a particular load point of a supply network in the electronic device may be estimated by simulation, and, based on the respective impedance of the part of the supply network, the threshold to the power consumption for that part of the electronic device may be set based on determining an acceptable voltage droop on the load point caused by said power consumption.

Optionally, the method includes defining, in the scan clock pattern, an amount of stretching in dependence of said expected drop of the supply voltage. The amount of stretching may be derived based on an expected drop of the supply voltage on power supply lines in the electronic device that are coupled to a set of logical elements that have to perform the scan shifting. For example, the amount of stretching may be derived based on the number of the set of logical elements that have to change logical state in a particular shift cycle.

Optionally, the method includes determining a power consumption in multiple parts of the electronic device during respective shift cycles of the scan shift mode, said parts having respective multiple supply lines inside the electronic device, and determining the at least one shift cycle where said expected drop of the supply voltage on any of the multiple supply lines exceeds a predetermined threshold. In practice, the voltage drop of the supply voltage may significantly be different in different parts of the electronic device. This may be dependent on the respective scan-in data, i.e. for some first shift cycles of a particular scan pattern a first part of the electronic device may experience strong voltage droop, while for other second shift cycles of the particular scan pattern a second part of the electronic device may experience strong voltage droop. The power shift cycles and their corresponding amount of stretching are based on the voltage drop in said first part for said first shift cycles, and on the voltage drop in said second part for said second shift cycles.

Optionally, in the electronic device, the logical elements are coupled to at least one supply power line, and the method comprises determining an impedance characteristic of the supply power line for determining said voltage drop. Determining the respective supply power line impedance may be based on the impedance elements as described above with reference to FIG. 3.

Optionally, generating the scan pattern additionally includes adapting the scan pattern in dependence of the at least one power shift cycle for reducing said stretching, and subsequently adapting the scan clock pattern. Additionally to the stretching of said power shift cycles, the method may include further adapting the initially generated scan data to further reduce the number of power shift cycles, and/or the amount of stretching necessary. For example, when a particularly strong voltage drop is caused by a single power shift cycle, the scan data may be adapted to spread any required changes across two adjacent clock pulses.

Figure 6:
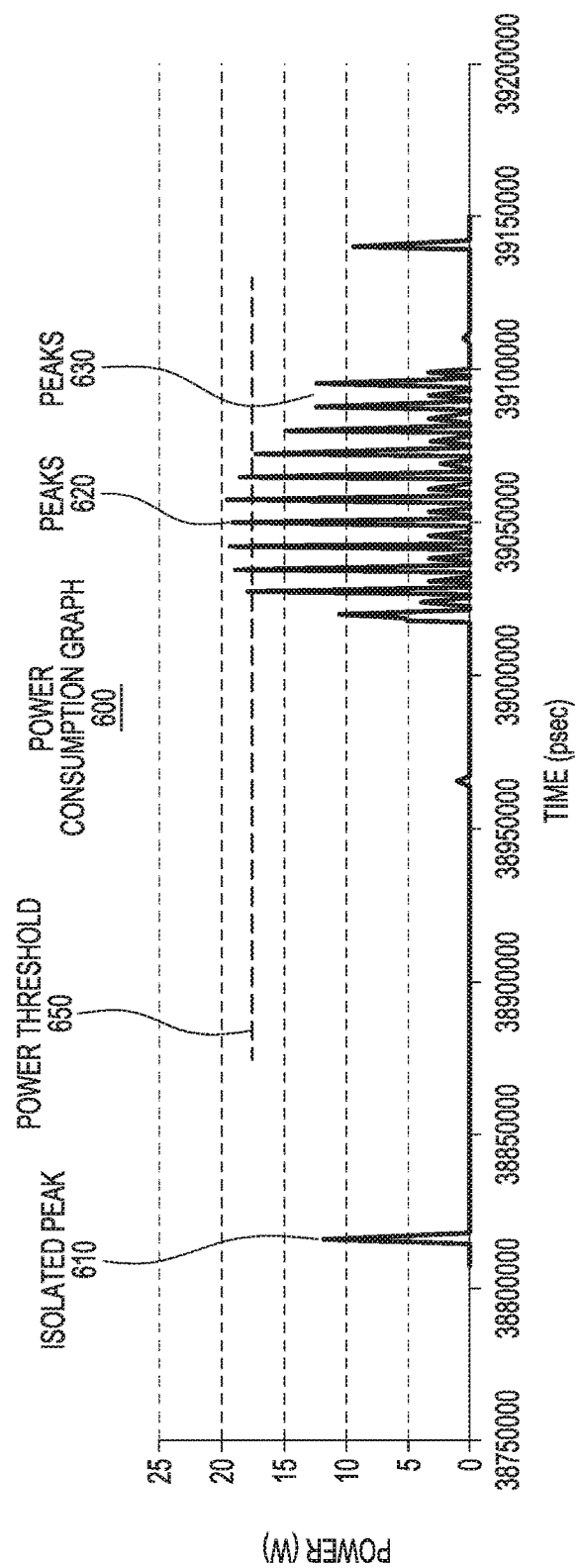
FIG. 6 shows an example of power consumption during scan testing.

FIG. 6 shows an example of power consumption during scan testing. In a graph a power consumption 600 of an electronic device is indicated on the vertical axis, whereas time is represented on the horizontal axis. The power consumption has a first, isolated peak 610 representing power at a capture mode clock cycle, i.e. in the operational mode, while a sequence of peaks 620,630 indicates power consumption during scan shift mode. A power threshold 650 depicted as a dashed line, indicates a power level that, when exceeded, is expected to cause an excessive power supply voltage drop. The threshold indicates a maximum allowed power consumption level to keep supply voltage drop effectively low so as not to affect the proper scanning at the selected scan clock frequency. For example, lower power supply voltage increases delay times. A few scan clock cycles 620, called power shift cycles, do exceed the power threshold, whereas other scan clock cycles 620 have less power consumption below said threshold. The power shift cycles will be stretched as discussed above so as to avoid excessive increased delays.

It is noted that different fragments of a scan test pattern may result in different power profiles, i.e. having different power shift pulses that exceed the threshold. It is noted that multiple thresholds may be applied to determine the amount of delay associated with a particular power cycle, and to determine a corresponding amount of stretching.

Figure 7:
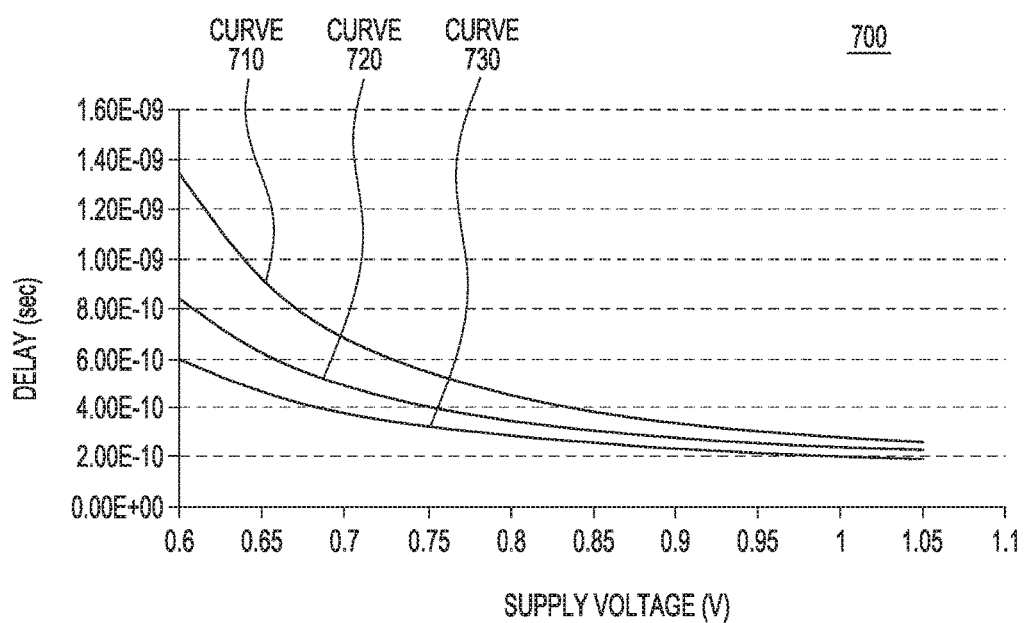
FIG. 7 shows a delay in a scan path in dependency of supply voltage.

FIG. 7 shows a delay in a scan path in dependency of supply voltage. In a graph a delay 700 of an electronic circuit is indicated on the vertical axis, whereas supply voltage (Vdd) is represented on the horizontal axis. The voltage Vdd nominally is 0.95V, and operationally 0.9 V (allowing 50 mV voltage drop over the circuit power distribution network) may remain. The three curves 710, 720, 730 represent characteristic delay caused by voltage drop during shifting for MOSFET devices having high threshold voltage (HVT), standard threshold voltage (SVT) and low threshold voltage (LVT), which are part of the integrated electronic device. In the example, in a relatively heavy shift cycle causing a lot of power consumption, the supply voltage may drop down to 0.6 V causing 1.4 ns extra delay for a single MOSFET device. (note that the circuit logic path may contain 20, 50 or even 100 such devices in series, each of them experiencing various device delays). During a less heavy shift the supply voltage may drop down to 0.75 V causing 0.6 ns extra delay, while at the operational voltage of 0.9 V the delay is only around 0.3 ns.

The three curves represent different types of the MOSFET devices used in typical integrated electronic circuit, based on the type of the threshold voltage, setting the switching speed (LVT has the highest speed, HVT has lowest speed) and the device leakage current (LVT has greatest, HVT has lowest). Normal design practice suggests usage of high Vthreshold devices (HVT) to save leakage power unless the operational speed requires lower Vthreshold usage to decrease the MOSFET's delays. Mixing of the threshold voltages during design is normally allowed.

From the Figure it can be seen that during a part of the scan shifting that has high power consumption, the function of the shift path is performed at the voltage 150-300 mV lower than nominal, which increases the propagation delay by the factor of 4 to 5. Path delay appears to be exponentially proportional to the voltage droop, while the voltage droop is directly proportional to the power consumption. For example, an expected power consumption and thus voltage droop difference of 30% may cause a path delay increase of about 150%.

To avoid that such delays affect a proper operation during the next shift clock cycle, the respective power shift cycles are stretched. Assume e.g. 30% shift cycles with exaggerated power consumption which need to be stretched and 70% with moderate power consumption which can be used at a relatively high scan clock frequency. Now the base scan clock shift frequency may be increased by 50%, while at the same time stretching said power shift cycles. Total device test time (DT) may then be calculated to be reduced by $$DT=1-((0.3*2+0.7*1)/1.5)=13\%$$

It is noted that the proposed stretching is clearly different from lowering the scan shift clock frequency so as to accommodate the voltage droop caused by power shift cycles. Usually the power consumption in different shift cycles is quite varied and it is not convenient to set the frequency of entire pattern based on max power consumed in only a few or even a single cycle. Also only modifying the scan-in data in the scan pattern so as to avoid excessive power consumption is less convenient. Such a method may reduce power consumption, but may also limit the test cube, thus reducing the test coverage. Instead, it is now proposed not to change the value of scan data, but only to stretch the critical shift cycles or to insert dummy cycles if required.

In summary, the proposed system provides an ability to distinguish between heavy current consuming shift cycles and normal current consuming shift cycles at scan shifting, and effectively increase the length of heavy current consuming cycles to mitigate for excessive supply voltage drop caused by the heavy current consumption at the stage of pattern generation, i.e. effectively allowing more time for the critical paths to complete. At the same time the "base" shift frequency can be increased because less current consuming cycles will not cause functional failure. Advantageously, a relatively high scan shift frequency may be used while avoiding detrimental effects of said voltage drop by extending the respective power shift cycle, whereby test time is decreased and yield loss is reduced.

Figure 8:
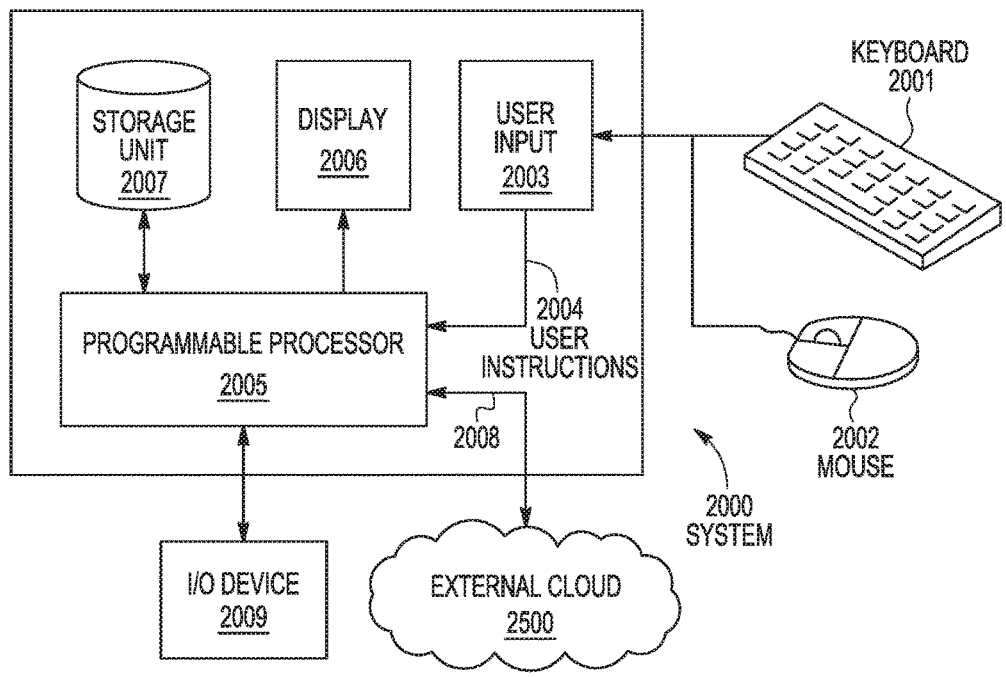
FIG. 8 schematically shows an exemplary scan test development system.

FIG. 8 schematically shows an exemplary scan test development system. The system 2000 has a programmable processor 2005, and is depicted as a personal computer, but may be any type of processing system. Other embodiments may include a different type of computer system, such as a mainframe, minicomputer, server, or workstation. A typical computer system includes at least one processing unit, associated memory and a number of input/output (I/O) devices.

The system 2000 is shown having a storage unit 2007, a user input 2003 and a display 2006. The user input 2003 allows the user to input user data and user instructions 2004 to the processor 2005 by e.g. using a keyboard 2001 or a mouse 2002. Also, although not shown, the display 2006 may comprise a touch-sensitive surface for enabling the user to provide user data and user instructions to the user input 2003 by means of touching the display 2006. The processor 2005 is arranged to perform any one of the methods according to the invention, to receive user data and user instructions 2004, to present visual information on the display 2006 and to communicate with a data I/O device 2009, such as an optical disc drive or a solid state reader/writer. The processor 2005 is arranged to cooperate with the storage unit 2007, allowing storing and retrieving information on the storage unit 2007, such as storing and retrieving structural data or parameters of the electronic device to be tested. The user interaction system 2000 may further comprise a communication channel 2008 allowing the processor 2005 to connect to an external cloud 2500 for communicating with other devices in the cloud. The external cloud may e.g. be the Internet. The processor 2005 may be capable to read, using the data I/O device 2009, a computer readable medium comprising a program code. The processor 2005 may be capable to read, using the data I/O device 2007, a computer readable medium comprising a computer program product comprising instructions for causing the user interaction system 2000 to perform a method of generating scan test patterns as described above. The method may comprise further actions as described with reference to FIG. 1-FIG. 7.

The system 2000 may be an integrated development environment IDE. Thereto the scan test development system may include test equipment or interfaces, e.g. a scan tester as described above for enabling an actual scan test of an electronic device, e.g. to verify the correctness of the scan patterns and clock scan patterns.

Optionally, the scan tester includes the test interface for providing the scan clock having said stretched power shift cycle. In practice the test interface may either be a separate unit including the clock control unit for operationally stretching the scan shift clock pulses in dependence of the scan clock pattern, e.g. via a clock gate that blocks the scan shift clock when a corresponding data field in the scan clock pattern indicates to stretch the current scan clock cycle. Alternatively, the electronic device may include logical elements of the test interface to perform said clock control.

Optionally, the scan clock pattern includes clock stretch data indicative of the amount of stretching of the corresponding scan clock pulse. The scan tester may have a memory unit that stores the actual scan clock pattern including said clock stretch data.

Optionally, in the scan tester the scan clock pattern comprises dummy clock data indicative of instants where the corresponding scan clock pulse is to be omitted for stretching the power shift cycle. Furthermore, the scan tester may be arranged for providing a clock stretch signal based on the clock stretch data, and the clock control unit is arranged for stretching the power shift cycle based on the clock stretch signal.

Figures 9, 10:
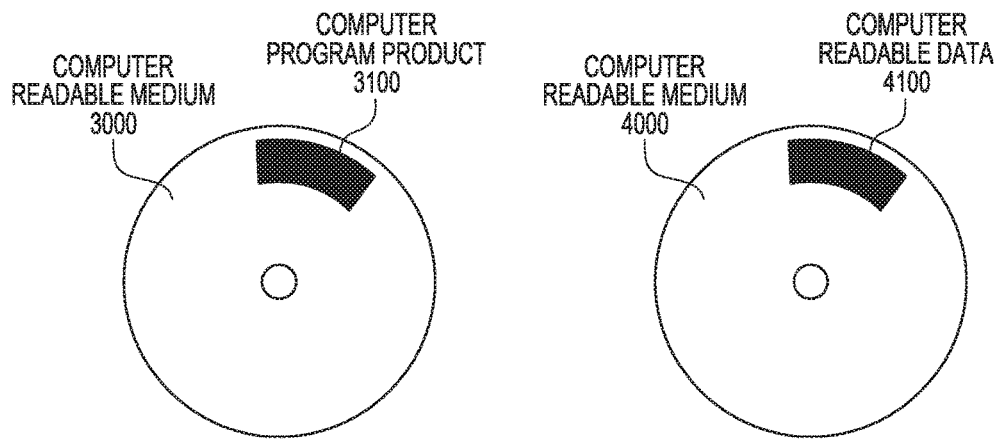
FIG. 9 schematically shows a computer readable medium carrying a computer program product, and FIG. 10 schematically shows a computer readable medium carrying computer readable data.

FIG. 9 schematically shows a computer readable medium carrying a computer program product. The computer program product 3100 has instructions for causing a processor apparatus to perform a method for generating at least one scan pattern for a scan tester for scan test of an electronic device having a digital function as described above. The method may include any further action as described with reference to the FIGS. 1-8. The computer program product 3100 may be embodied on a computer readable medium 3000 as physical marks or by means of magnetization of the computer readable medium 3000. Furthermore, although the computer readable medium 3000 is shown in FIG. 9 as an optical disc, the computer readable medium 3000 may be any suitable computer readable medium, such as a hard disk, solid state memory, flash memory, etc., and may be non-recordable or recordable.

The invention may thus be implemented in a computer program for running on a computer system, at least including code portions for performing steps of the above described methods when run on a programmable apparatus, such as a computer system or enabling a programmable apparatus to perform said functions. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

FIG. 10 schematically shows a computer readable medium carrying computer readable data. The computer readable medium 4000 may be a data carrier, such as a CD-ROM or diskette, stored with the computer-readable information 4100. The data carrier may further be a data connection, such as a telephone cable or a wireless connection. The computer readable data 4100 comprises one or more scan patterns including the scan clock patterns as described above. The one or more scan patterns may be in a standardized format, or in any other suitable format suitable for a scan tester 100.

The computer readable media 3000,4000 may be permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.); nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Because the system implementing the present invention is, for the most part, composed of units known to those skilled in the art, details of such units will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. Any description of processing architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Also, devices functionally forming separate devices may be integrated in a single physical device.

However, other modifications, variations and alternatives are also possible. The specifications and drawings are, accordingly, to be regarded in an illustrative rather than in a restrictive sense.

Features described with reference to one example may be combined with features described with reference to another example to obtain further examples or embodiments. Features described with reference to one or more methods may correspondingly be implemented with one or more systems, devices and computer program products, and vice versa.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. Method for generating at least one scan pattern for a scan tester for scan test of an electronic device having a digital function, the device having logical elements operationally coupled for performing the digital function and also coupled via a scan path for performing a scan test according to at least one scan pattern defining a sequence of scan-in data corresponding to a starting state of the logical elements, and the scan tester being arranged to be coupled via a test interface to the electronic device, the test interface having a scan clock, a scan-in signal and a scan-out signal, and the scan tester being arranged for executing a scan shift mode in which the scan-in data is shifted from the scan tester to the logical elements via the scan path and/or device data is shifted from the logical elements to the scan tester; and a capture mode in which the device is performing the digital function for a predetermined number of operational clock cycles; and the test interface having a clock control unit for stretching a shift cycle of the scan clock in dependence of a scan clock pattern, and the method comprising:

generating the scan pattern in dependence of the logical elements and the digital function;

determining at least one power shift cycle which is expected to cause a voltage drop of a supply voltage exceeding a predetermined threshold during respective shift cycles of the scan shift mode; and generating, in addition to the scan pattern, the scan clock pattern indicative of stretching the power shift cycle.

2. The method of claim 1, wherein the scan clock pattern comprises clock stretch data indicative of the amount of stretching of the corresponding scan clock pulse.

3. The method of claim 1, wherein the scan clock pattern comprises dummy clock data indicative of instants where the corresponding scan clock pulse is to be omitted for stretching the power shift cycle.

4. The method as claimed in claim 1, comprising determining a power consumption in at least a part of the electronic device during respective shift cycles of the scan shift mode, and determining the at least one power shift cycle where the power consumption exceeds a predetermined threshold.

5. The method as claimed in claim 1, comprising determining a power consumption in at least a part of the electronic device during respective shift cycles of the scan shift mode, and comprising determining the voltage drop in dependence of the power consumption so determined.

6. The method as claimed in claim 1, comprising defining, in the scan clock pattern, an amount of stretching in dependence of said expected drop of the supply voltage.

7. The method as claimed in claim 1, comprising determining a power consumption in multiple parts of the electronic device during respective shift cycles of the scan shift mode, said parts having respective multiple supply lines inside the electronic device, and determining the at least one shift cycle where said expected drop of the supply voltage on any of the multiple supply lines exceeds a predetermined threshold.

8. The method as claimed in claim 1, wherein, in the electronic device, the logical elements are coupled to at least one supply power line, and the method comprises determining an impedance characteristic of the supply power line for determining said voltage drop.

9. The method as claimed in claim 1, wherein generating the scan pattern comprises adapting the scan pattern in dependence of the at least one power shift cycle for reducing said stretching, and subsequently adapting the scan clock pattern.

10. Scan tester for scan test of an electronic device having a digital function, the device includes logical elements operationally coupled for performing the digital function and also coupled via a scan path for performing a scan test according to at least one scan pattern defining a sequence of scan-in data corresponding to a starting state of the logical elements, Wherein the scan tester is coupled via a test interface to the electronic device, the test interface having a scan clock, a scan-in signal and a scan-out signal, and wherein the scan tester is configured to execute:

a scan shift mode in which the scan-in data is shifted from the scan tester to the logical elements via the scan path and/or device data is shifted from the logical elements to the scan tester, and a capture mode in which the device is performing the digital function for a predetermined number of operational clock cycles for propagating from the starting state to a resulting state, and wherein the test interface includes a clock control unit for stretching a power shift cycle of the scan clock in dependence of a scan clock pattern, the scan tester comprises: the scan clock pattern indicative of stretching the power shift cycle which is expected to cause a voltage drop of a supply voltage exceeding a predetermined threshold during respective shift cycles of the scan shift mode.

11. The scan tester of claim 10, the scan tester comprising the test interface for providing the scan clock having said stretched power shift cycle.

12. The scan tester as claimed in claim 10, wherein the scan clock pattern comprises clock stretch data indicative of the amount of stretching of the corresponding scan clock pulse.

13. The scan tester as claimed in claim 10, wherein the scan clock pattern comprises dummy clock data indicative of instants where the corresponding scan clock pulse is to be omitted for stretching the power shift cycle.

14. The scan tester as claimed in claim 10, wherein the scan tester is arranged for providing a clock stretch signal based on the clock stretch data, and the clock control unit is arranged for stretching the power shift cycle based on the clock stretch signal.

15. An electronic device configured to be used with a scan tester, the device comprising: logical elements operationally coupled for performing the digital function and also coupled via a scan path for performing a scan test according to at least one scan pattern defining a sequence of scan-in data corresponding to a starting state of the logical elements, wherein the scan tester is coupled via a test interface to the electronic device, the test interface comprising a scan clock, a scan-in signal and a scan-out signal, and the scan tester configured to execute:

a scan shift mode in which the scan-in data is shifted from the scan tester to the logical elements via the scan path and/or device data is shifted from the logical elements to the scan tester, and a capture mode in which the device is performing the digital function for a predetermined number of operational clock cycles, and the device comprising a clock control unit for stretching a shift cycle of the scan clock in dependence of a scan clock pattern, and wherein the scan pattern comprises the scan clock pattern indicative of stretching a power shift cycle which is expected to cause a voltage drop of a supply voltage exceeding a predetermined threshold during respective shift cycles of the scan shift mode.

16. The electronic device as claimed in claim 15, wherein the clock control unit is arranged for deriving a stretching signal from a multitude of device inputs for providing the scan clock having said stretched shift cycle that follows the power shift cycle.

17. An integrated circuit comprising the electronic device according to claim 15.

* * * * *